United States Patent
Tsai et al.

(10) Patent No.: US 9,048,458 B2
(45) Date of Patent: Jun. 2, 2015

(54) METHOD OF FABRICATING PIXEL STRUCTURE FOR ORGANIC LIGHT-EMITTING DISPLAY

(71) Applicants: Min-Han Tsai, Chu-Nan (TW);
Hao-Jung Huang, Chu-Nan (TW);
Chien-Tzu Chu, Chu-Nan (TW)

(72) Inventors: Min-Han Tsai, Chu-Nan (TW);
Hao-Jung Huang, Chu-Nan (TW);
Chien-Tzu Chu, Chu-Nan (TW)

(73) Assignee: INNOLUX CORPORATION (TW)

( * ) Notice: Subject to any disclaimer, the term of this patent is extended or adjusted under 35 U.S.C. 154(b) by 0 days.

(21) Appl. No.: 13/759,823

(22) Filed: Feb. 5, 2013

(65) Prior Publication Data

US 2013/0203197 A1 Aug. 8, 2013

(30) Foreign Application Priority Data

Feb. 6, 2012 (TW) .............................. 101103724 A (51) Int. Cl.
*H01L 51/56* (2006.01)
*H01L 27/32* (2006.01)
*H01L 51/52* (2006.01)
*H01L 51/00* (2006.01)

(52) U.S. Cl.
CPC ............ *H01L 51/56* (2013.01); *H01L 27/3246* (2013.01); *H01L 27/3279* (2013.01); *H01L 51/5212* (2013.01); *H01L 27/323* (2013.01); *H01L 51/0023* (2013.01); *H01L 27/3276* (2013.01); *H01L 51/5228* (2013.01)

(58) Field of Classification Search
CPC ............ H01L 27/3276; H01L 27/3246; H01L 27/3279; H01L 51/5212; H01L 2227/323
See application file for complete search history.

(56) References Cited

U.S. PATENT DOCUMENTS

| | | | |
|---|---|---|---|
| 2005/0270259 A1* | 12/2005 | Shirasaki et al. ............... | 345/76 |
| 2008/0068324 A1* | 3/2008 | Chung et al. .................... | 345/98 |
| 2009/0015151 A1* | 1/2009 | Ishihara et al. ............... | 313/504 |
| 2011/0248297 A1* | 10/2011 | Ito .................................. | 257/93 |
| 2011/0254757 A1* | 10/2011 | Kim ................................ | 345/76 |
| 2012/0056214 A1* | 3/2012 | Sakakura et al. ............... | 257/88 |
| 2012/0074834 A1* | 3/2012 | Kanegae ....................... | 313/498 |
| 2012/0146030 A1* | 6/2012 | You et al. ........................ | 257/59 |

* cited by examiner

*Primary Examiner* — Bac Au
(74) *Attorney, Agent, or Firm* — Lowe Hauptman & Ham, LLP (57) ABSTRACT

A method of fabricating a pixel structure for an organic light-emitting display (OLED) is disclosed. A substrate having at least a sub-pixel region is provided. An auxiliary electrode layer and an insulating layer are formed on the substrate in the sub-pixel region, wherein the insulating layer has an opening to expose the auxiliary electrode layer. A lower electrode layer, an organic light emission layer, and an upper electrode layer are formed on the substrate, wherein the organic light emission layer fills the opening in the insulating layer. Another opening is formed in the upper electrode layer and the organic light emission layer directly on the opening in the insulating layer by performing a laser process, such that the upper electrode layer and the auxiliary electrode layer are welded together through the opening in the upper electrode layer and the organic light emission layer.

11 Claims, 7 Drawing Sheets

METHOD OF FABRICATING PIXEL STRUCTURE FOR ORGANIC LIGHT-EMITTING DISPLAY

CROSS REFERENCE TO RELATED APPLICATIONS

This application claims priority of Taiwan Patent Application No. 101103724, filed on Feb. 6, 2012, the entirety of which is incorporated by reference herein.

BACKGROUND

1. Technical Field

The disclosed embodiments relate to flat panel display devices, and in particular relates to a method of fabricating a pixel structure for an organic light-emitting display (OLED).

2. Description of the Related Art

Due to thin profiles, light weights and low power consumption provided by flat panel display (FPD) devices, related problems associated with cathode ray tube (CRT) display technology have been solved, and FDP devices are now widely applied in electronic devices, such as laptop computers, personal digital assistant (PDA), e-books (electronic books), projectors, and mobile phones. Generally, flat panel display devices include active matrix liquid crystal display (AMLCD) devices and active matrix organic light-emitting display (AMOLED) devices. Unlike the active matrix liquid crystal display devices, the active matrix organic light-emitting display devices are self-emissive devices using organic material without the requirement of a backlight module. Therefore, the manufacturing process is simplified and the thickness of flat panel display devices is further reduced. Typically, the pixel structure of active matrix organic light-emitting display devices comprises a thin film transistor (TFT) array substrate and a plurality of organic light-emitting diodes disposed thereon. Each organic light-emitting diode includes an upper electrode (a cathode or anode), a lower electrode (an anode or cathode), and an organic light-emitting layer disposed between the two electrodes.

In active matrix organic light-emitting display devices, an electrode contact hole is typically formed outside of the display region (or active region) such that the upper electrode of the organic light-emitting diode and the electronic devices on the TFT array substrate form a loop. However, the voltage drop (IR drop) effect results in a brightness difference between the central pixel region and the peripheral pixel region in the display region (i.e., poor brightness uniformity). In top emission light-emitting display devices, metal (such as calcium, magnesium, lithium, silver and alloys thereof) or the combination with transparent conductive oxide (such as indium tin oxide, indium zinc oxide, aluminum zinc oxide, zinc oxide) with resistance higher than metal are usually used as the upper electrode of the organic light-emitting diode, therefore the IR drop effect is more significant. Moreover, the problem of poor brightness uniformity is more serious for large-sized organic light-emitting display applications.

Therefore, there is a need to develop an improved method of fabricating a pixel structure for an organic light-emitting display (OLED), mitigating or eliminating the aforementioned problems.

SUMMARY

One of the broader forms of the present disclosure involves a method of fabricating a pixel structure for an organic light-emitting display. The method comprises: providing a substrate having a plurality of series of sub-pixel regions arranged in parallel; forming an auxiliary electrode layer on the substrate, wherein the auxiliary electrode layer corresponds to at least a sub-pixel region in the plurality of series of sub-pixel regions; forming a first insulating layer on the substrate and covering the auxiliary electrode layer, wherein the first insulating layer has at least a first opening to partially expose the auxiliary electrode layer; forming a lower electrode layer on the substrate in each sub-pixel region in the plurality of series of sub-pixel regions; forming an organic light-emitting layer on each lower electrode layer, filling the first opening; forming an upper electrode layer on the organic light-emitting layer; and performing a laser process to form at least a third opening therein in the upper electrode layer and the organic light-emitting layer directly on the first opening, such that the upper electrode layer and the auxiliary electrode layer are connected via welding through the third opening.

In some embodiments, the method further comprises: forming a second insulating layer between each lower electrode layer and the organic light-emitting layer, wherein the second insulating layer has a second opening corresponding to each lower electrode layer, such that the organic light-emitting layer contacts with each lower electrode layer through the second opening.

In some embodiments, the first opening is a hole or a strip trench.

In some embodiments, the third opening is a hole or a strip trench.

In some embodiments, a plurality of third openings are formed in the organic light-emitting layer by performing the laser process, such that the plurality of third openings are arranged in at least one of the plurality of series of sub-pixel regions.

In some embodiments, the plurality of third openings are correspondingly arranged in each sub-pixel region of the at least one series of sub-pixel regions.

In some embodiments, the adjacent ones in the plurality of third openings are separated by at least a sub-pixel region without the third opening.

In some embodiments, the plurality of third openings are arranged in at least two of the plurality of series of sub-pixel regions, and the at least two of the plurality of series of sub-pixel regions are separated by at least one series of sub-pixel region without the third opening.

In some embodiments, each sub-pixel region in the at least one series of sub-pixel regions is employed to display the same color.

In some embodiments, the at least one series of sub-pixel regions includes sub-pixel regions for displaying different colors.

In some embodiments, the auxiliary electrode layer and the lower electrode are formed by the same conductive layer.

Another broader form of the present disclosure involves a method of fabricating a pixel structure for an organic light-emitting display. The method comprises: providing a substrate having a plurality of series of sub-pixel regions arranged in parallel; forming an auxiliary electrode layer on the substrate, wherein the auxiliary electrode layer corresponds to at least a sub-pixel region in the plurality of series of sub-pixel regions; forming a first insulating layer on the substrate and covering the auxiliary electrode layer, wherein the first insulating layer has at least a first opening to partially expose the auxiliary electrode layer; forming a lower electrode layer on the substrate in each sub-pixel region in the plurality of series of sub-pixel regions; forming an organic light-emitting layer on each lower electrode layer, filling the first opening; performing a laser process in the organic light-emitting layer directly on the first openings to form at least a third opening therein, such that the auxiliary electrode layer is exposed; and forming an upper electrode layer on the organic light-emitting layer and filling the third opening, such that the upper electrode layer and the auxiliary electrode layer are electrically connected.

In some embodiments, the method further comprises: forming a second insulating layer between each lower electrode layer and the organic light-emitting layer, wherein the second insulating layer has a second opening corresponding to each lower electrode layer, such that the organic light-emitting layer contacts with each lower electrode layer through the second opening.

In some embodiments, the first opening is a hole or a strip trench.

In some embodiments, the third opening is a hole or a strip trench.

In some embodiments, a plurality of third openings are formed in the organic light-emitting layer by performing the laser process, such that the plurality of third openings are arranged in at least one of the plurality of series of sub-pixel regions.

In some embodiments, the plurality of third openings are correspondingly arranged in each sub-pixel region of the at least one series of sub-pixel regions.

In some embodiments, the adjacent ones in the plurality of third openings are separated by at least a sub-pixel region without the third opening.

In some embodiments, the plurality of third openings are arranged in at least two of the plurality of series of sub-pixel regions, and the at least two of the plurality of series of sub-pixel regions are separated by at least one series of sub-pixel region without the third opening.

In some embodiments, each sub-pixel region in the at least one series of sub-pixel regions is employed to display the same color.

In some embodiments, the at least one series of sub-pixel regions includes sub-pixel regions for displaying different colors.

In some embodiments, the auxiliary electrode layer and the lower electrode are formed by the same conductive layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
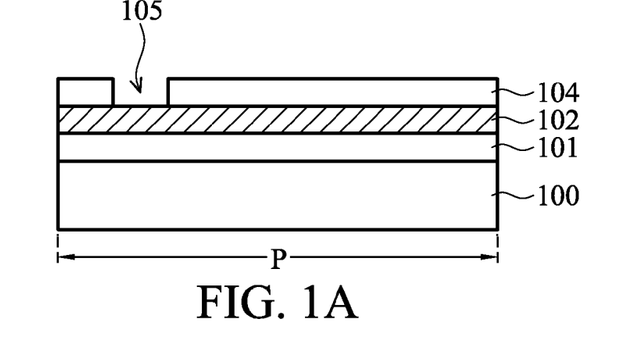
FIGS. 1A-1D are cross-sections of an embodiment of a method of fabricating a pixel structure for an organic light-emitting display (OLED) according to the invention.
Figure 3:
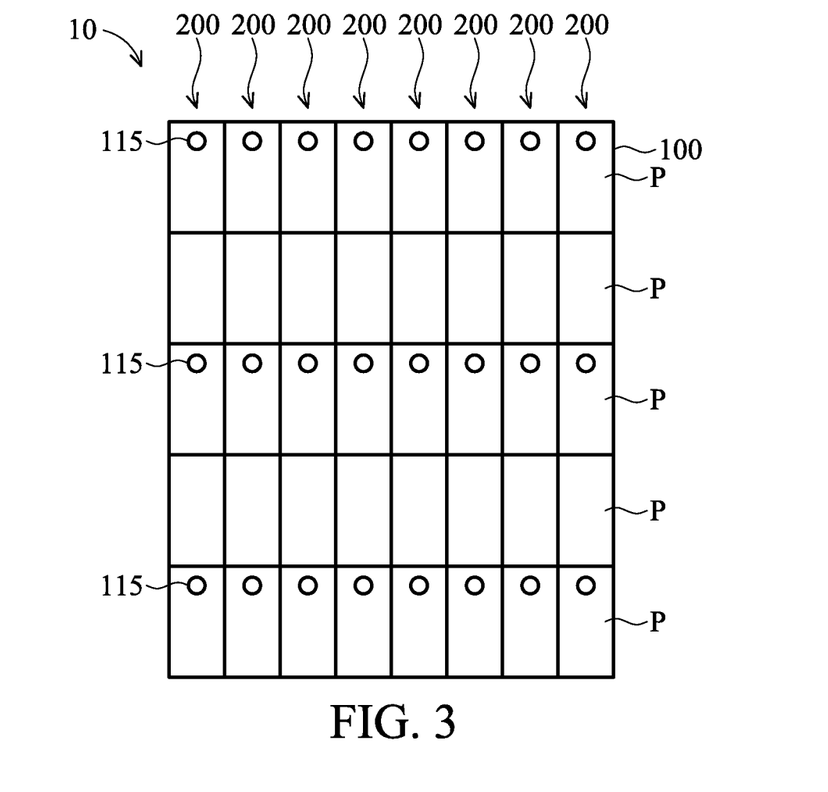
FIG. 3 is a plan view of an embodiment of an arrangement of electrode contact holes according to the invention.

FIGS. 1A-1D are cross-sections of an embodiment of a method of fabricating a pixel structure 10 for an organic light-emitting display (OLED) according to the invention. Referring to FIG. 1A, a substrate 100 is provided, which has a plurality of series of sub-pixel regions 200 (as shown in FIG. 3) arranged in parallel to form a pixel array region (also referred as a display region or an active region). It is understood that each series of sub-pixel regions 200 includes a plurality of sub-pixel regions P adjacent to each other. Moreover, the number of series of sub-pixel regions 200 and the number of sub-pixel regions P in each series of sub-pixel region 200 depend on design requirements, and therefore are not limited to that shown in FIG. 3. Here, in order to simplify the diagram, only one sub-pixel structure with one sub-pixel region P is depicted. In this embodiment, the substrate 100 may comprise glass, quartz, or plastics, wherein a plurality of thin film transistors (not shown) correspond to a pixel array region, and therefore the substrate 100 is also referred as a thin film transistor array substrate. Moreover, the plurality of thin film transistors are covered by at least an insulating layer, such as an interlayer dielectric (ILD) layer, an inter-metal dielectric (IMD) layer, a planarization layer, a passivation layer or combinations thereof. Here, in order to simplify the diagram, only a planar insulating layer 101 is depicted.

Next, an auxiliary electrode layer 102 is formed on the insulating layer 101 by performing a deposition process, such as a chemical vapor deposition (CVD) or sputtering process, which corresponds to at least a sub-pixel region P in the series of sub-pixel region 200, as shown in FIG. 1A. In another embodiment, the auxiliary electrode layer 102 may correspond to each sub-pixel region P. The auxiliary electrode layer 102 may be coupled to a first power voltage (not shown). One of the source/drain of the corresponding thin film transistor in the substrate 100 may be coupled to a second power voltage (not shown), wherein there exists a voltage difference between the first power voltage and the second power voltage. In one embodiment, the auxiliary electrode layer 102 may comprise a conductive layer, for example, aluminum, silver, gold, nickel, chromium, copper, titanium, molybdenum, indium tin oxide, indium zinc oxide, aluminum zinc oxide, zinc oxide, or other metals well known in the art, transparent conductive oxide electrode materials, combinations thereof, or alloys thereof.

A first insulating layer 104 is formed on the substrate 100, covering the auxiliary electrode layer 102 and the insulating layer 101 thereunder by performing deposition processes such as a CVD, physical vapor deposition (PVD) or solution processes. The first insulating layer 104 may serve as a passivation layer, and may comprise organic material (for example, photoresist), silicon oxide, silicon nitride, silicon oxynitride ($SiO_xN_y$), metal oxides (for example, aluminum oxide) or combinations thereof. Thereafter, at least a first opening 105 is formed in the insulating layer 104 to partially expose the auxiliary electrode layer 102 thereunder by lithography and etching processes. In one embodiment, the first opening 105 may be a hole. In another embodiment, the first opening 105 may be a strip trench extended across the sub-pixel regions P to expose the auxiliary electrode layer 102 in other sub-pixel regions P.

Figure 1B:
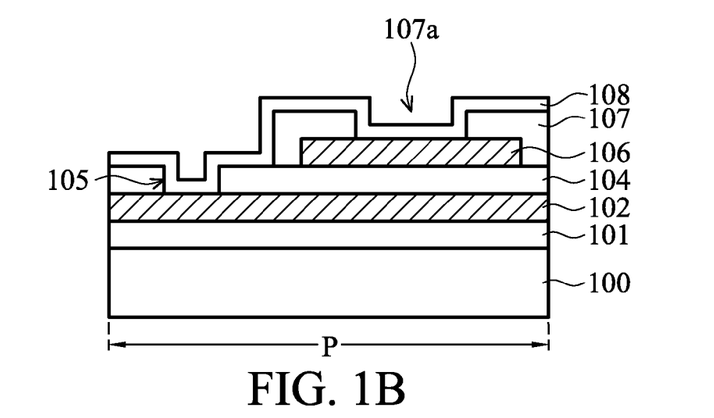

Referring to FIG. 1B, a lower electrode layer 106 is correspondingly formed on the first insulating layer 104 in each sub-pixel region P of each series of sub-pixel region 200 to serve as a lower electrode (an anode or cathode) for a subsequently formed organic light-emitting diode. The fabrication method and material of the lower electrode layer 106 may be similar to or the same as that of the auxiliary electrode layer 102. Moreover, the lower electrode layer 106 is coupled to the other source/drain of the corresponding thin film transistor in the substrate 100.

Referring to FIG. 1B again, a second insulating layer 107 is formed on each lower electrode layer 106, wherein the second insulating layer 107 has a second opening 107a to partially expose the lower electrode 106a. Then, an organic light-emitting layer 108 is formed on each lower electrode layer 106 to cover the first insulation layer 104 and the second insulating layer 107, and fill the first and second openings 105 and 107a so that the organic light-emitting layer 108 contacts with the auxiliary electrode 102 and the lower electrode 106. The second insulating layer 107 may comprises a material similar to or the same as that of the first insulating layer 104. The thickness of organic light-emitting layer 108 is in a range of about 600 angstroms (Å) to 4000 Å. The organic light-emitting layer 108 typically has a multi-layer structure, including a hole injection layer (HIL), a hole transport layer (HTL), an active layer, an electron transport layer (ETL) and an electron injection layer (EIL). Here, in order to simplify the diagram, only a single-layer structure is depicted.

Figure 1C:
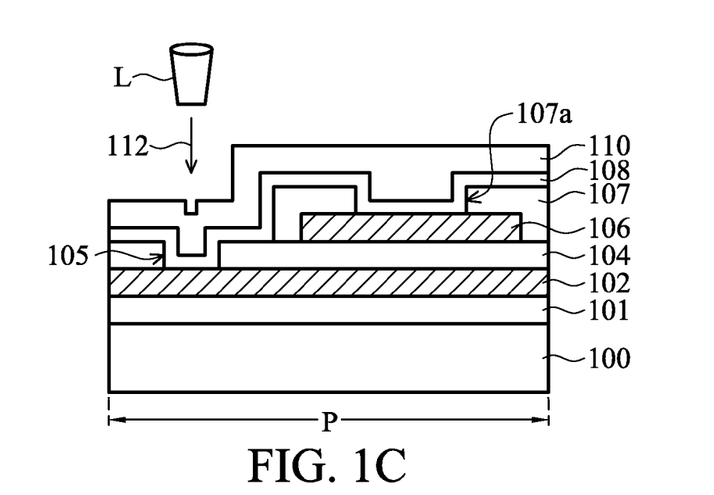

Referring to FIG. 1C, an upper electrode layer 110 is formed on the organic light-emitting layer 108 by a deposition process (such as PVD) to serve as an upper electrode (a cathode or anode) of the following organic light-emitting. In the embodiment, the upper electrode layer 110 may comprises metal (for example, magnesium, silver, lithium, calcium, silver, gold or alloy thereof), transparent conductive oxide (for example, indium tin oxide (ITO), indium zinc oxide (IZO), aluminum-zinc oxide (AZO), zinc oxide (ZnO)), or combinations thereof. Thereafter, a laser device L is provided to perform a laser process 112 (for example, a laser welding process) on the upper electrode layer 110 and the organic light-emitting layer 108 directly on the first opening 105.

Figure 1D:
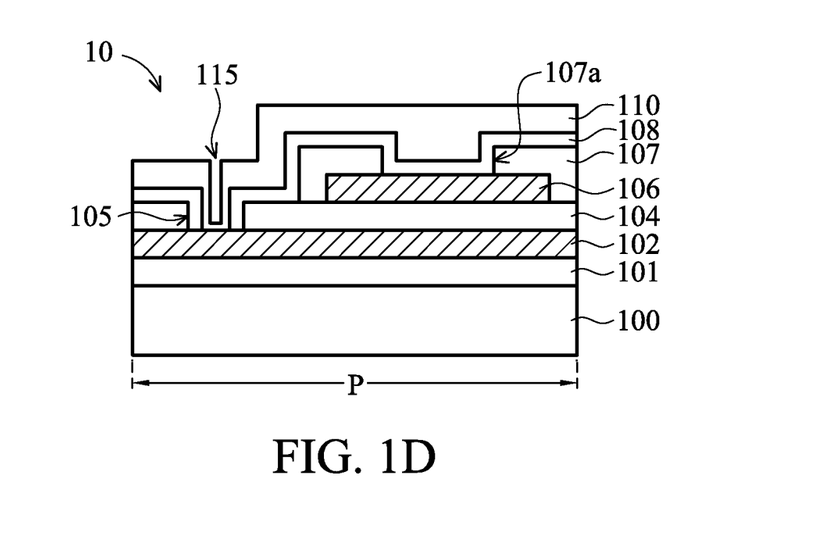

Referring to FIG. 1D, after the laser process 112, at least a third opening 115 may be formed in the upper electrode layer 110 and the organic light-emitting layer 108 directly on the first opening 105 to partially expose the auxiliary electrode layer 102 at the bottom of the first opening 105. At the same time, the upper electrode layer 110 and the auxiliary electrode layer 102 at the bottom of the first opening 105 are welded together through the third opening 115 by the laser process 112 to form an electrical connection. Namely, the upper electrode layer 110 is coupled to the first power voltage through the auxiliary electrode layer 102. The description of the fabrication of a pixel structure 10 for an organic light-emitting display in the embodiment is completed. In the embodiment, the wavelength and energy of laser used in the laser process 112 is 532 nm and 0.2 mJ, respectively. The types, wavelength and energy of laser can be varied and may not be limited to the embodiment. Moreover, the third opening 115 serves as an electrode contact hole, which may be a hole. In other embodiments, the third opening 115 may be a strip trench extended across the sub-pixel regions P to expose the auxiliary electrode layer 102 in other sub-pixel regions P.

Figure 1E:
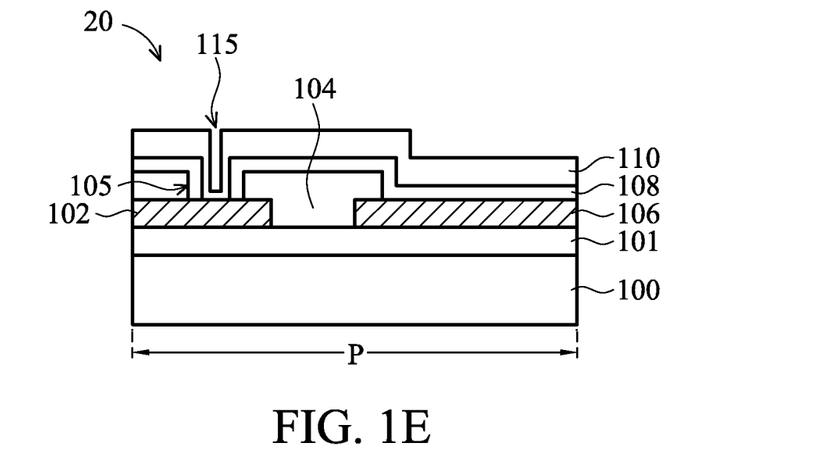
FIG. 1E is a cross-section of an embodiment of a pixel structure for an organic light-emitting display (OLED) according to the invention.

Refer to FIG. 1E, which is a cross-section of an embodiment of a pixel structure 20 for an organic light-emitting display according to the invention. Elements in FIG. 1E that are the same as those in FIGS. 1A-1D are labeled with the same numbers as in FIGS. 1A-1D and are not described again for brevity. In the embodiment, the fabrication method of the pixel structure 20 is similar to that of the pixel structure 10, except that the lower electrode layer 106 and the auxiliary electrode layer 102 may be formed by patterning the same conductive layer, such that the electrode layer 106 and the auxiliary electrode layer 102 is at the same level. In this case, the lower electrode layer 106 may be covered by the second insulating layer 104, and the second insulation layer 104 may have openings to expose the lower electrode layer 106 so that a subsequently formed organic light-emitting layer 108 may contact with the second insulation layer 104.

Figure 2A:
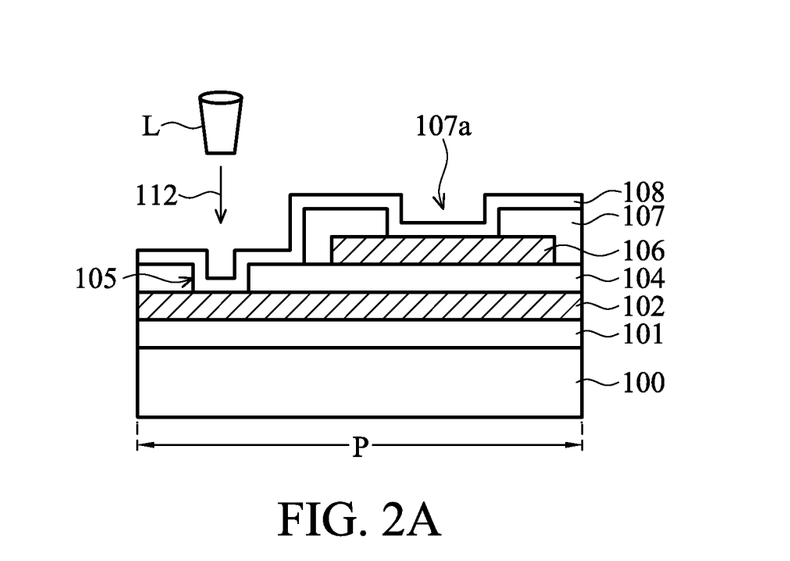
FIGS. 2A-2C are cross-sections of an embodiment of a method of fabricating a pixel structure for an organic light-emitting display (OLED) according to the invention.
Figure 2B:
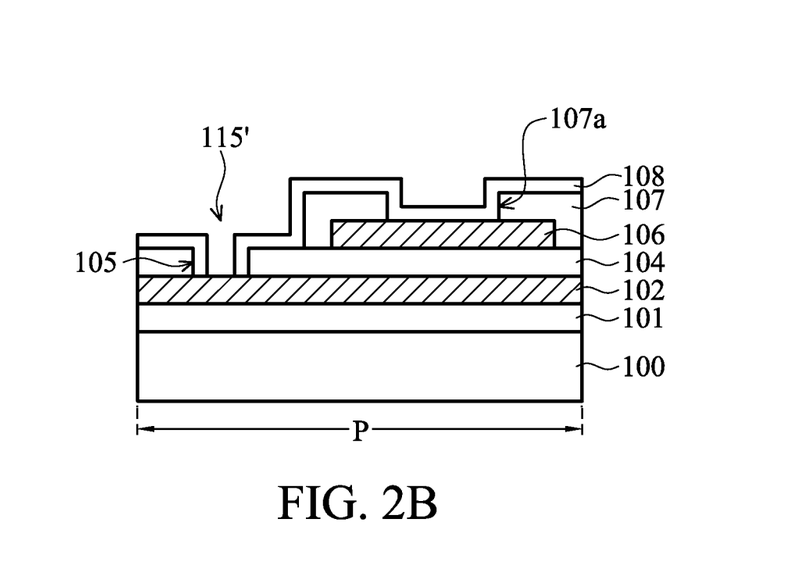
Figure 2C:
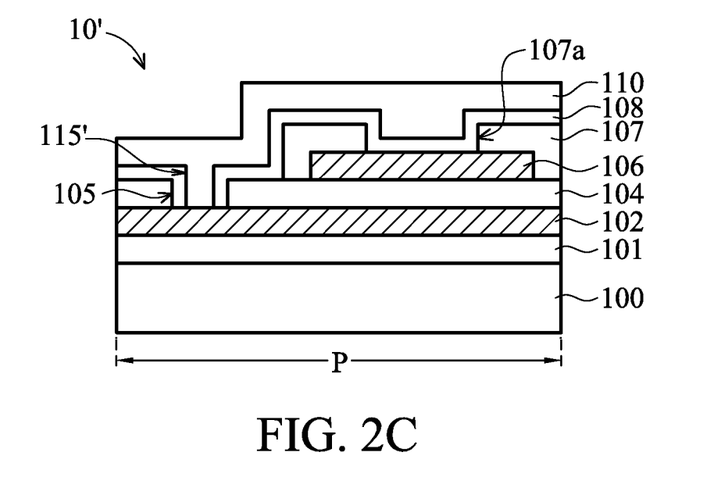

FIGS. 2A-2C are cross-sections of an embodiment of a method of fabricating a pixel structure 10' for an organic light-emitting display (OLED) according to the invention. Elements in FIGS. 2A-2C that are the same as those in FIGS. 1A-1D are labeled with the same numbers as in FIGS. 1A-1D and are not described again for brevity. Referring to FIG. 2A, which provides a structure similar to the structure shown in FIG. 1B. The structure includes a substrate 100 with a sub-pixel region P. An auxiliary electrode layer 102 is on the substrate 100 in the sub-pixel region P. A first insulating layer 104 is disposed on the substrate 100 and covers the auxiliary electrode layer 102, wherein the first insulating layer 104 has at least a first opening 105 to partially expose the auxiliary electrode layer 102. A lower electrode layer 106 (i.e., a lower electrode, or anode, of the organic light-emitting diode) is disposed on the first insulating layer 104 in the sub-pixel region P. An organic light-emitting layer 108 is formed on the second insulating layer 107 over the lower electrode layer 106, and fills the first opening 105 and the second opening 107a. In the embodiment, the structure may be formed through the process steps shown in FIGS. 1A-1B. Then, a laser device L is provided to perform a laser process 112 on the organic light-emitting layer 108 directly on the first opening 105. In the embodiment, the laser wavelength is 266 nm and the laser energy range is in a range of 50 μJ to 100 μJ. The types, wavelength and energy of laser can be varied and may not be limited to the embodiment.

Referring to FIG. 2B, after the laser process 112 is performed, at least a third opening 115' may be formed in the organic light-emitting layer 108 directly on the first opening 105 to partially expose the auxiliary electrode layer 102 thereunder. The third opening 115 serves as an electrode contact hole, which may be a hole. In other embodiments, the third opening 115 may be a strip trench extended across the plurality of sub-pixel regions P to expose the auxiliary electrode layer 102 at the bottom of the first opening 105 in other sub-pixel regions P.

Referring to FIG. 2C, an upper electrode layer 110 (i.e., an upper electrode, or cathode, of the organic light-emitting diode) is formed on the organic light-emitting layer 108, and fills the third opening 115' so that the upper electrode layer 110 is electrically connected to the exposed auxiliary electrode layer 102. Namely, the upper electrode layer 110 is coupled to the first power voltage through the auxiliary electrode layer 102. The description of the fabrication of a pixel structure 10' for an organic light-emitting display of the embodiment is completed.

Figure 2D:
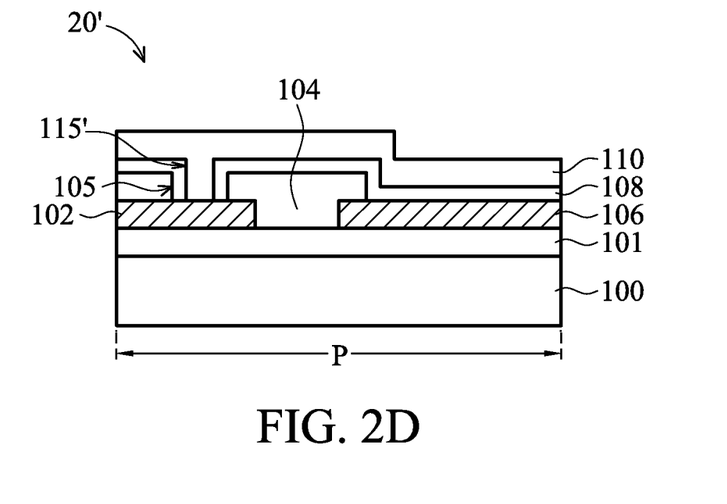
FIG. 2D is a cross-section of an embodiment of a pixel structure for an organic light-emitting display (OLED) according to the invention.

Refer to FIG. 2D, which is a cross-section of an embodiment of a pixel structure 20' for an organic light-emitting display according to the invention. Elements in FIG. 2D that are the same as those in FIGS. 2A-2C are labeled with the same numbers as in FIGS. 2A-2C and are not described again for brevity. In the embodiment, the fabrication method of the pixel structure 20' is similar to that of the pixel structure 10', except that the lower electrode layer 106 and the auxiliary electrode layer 102 may be formed by patterning the same conductive layer, such that the electrode layer 106 and the auxiliary electrode layer 102 is at the same level. In the embodiment, the lower electrode layer 106 may be covered by the second insulating layer 104, and the second insulation layer 104 may have openings to expose the lower electrode layer 106 so that a subsequently formed organic light-emitting layer 108 may contact with the second insulation layer 104.

Refer to FIG. 3, which is a plan view of an embodiment of an arrangement of electrode contact holes according to the invention. Elements in FIG. 3 that are the same as those in FIGS. 1A-1D are labeled with the same numbers as in FIGS. 1A-1D and are not described again for brevity. In the embodiment, in the pixel structure 10, a plurality of electrode contact holes (i.e. the third openings) 115 may be formed in the organic light-emitting layer 108 by the laser process (as shown in FIGS. 1C to 1D), and the plurality of electrode contact holes 115 can be regularly or irregularly arranged in at least a plurality of series of sub-pixel regions 200. For example, the plurality of electrode contact holes 115 may be regularly arranged in each series of sub-pixel regions 200, and the adjacent electrode contact holes 115 in each series of sub-pixel regions 200 are separated by at least a sub-pixel region P without an electrode contact hole 115. Moreover, each sub-pixel region P in at least a series of sub-pixel regions 200 is employed to display the same color, such as red, green, blue or white. In other embodiments, each series of sub-pixel regions 200 may include sub-pixel regions P for displaying different colors.

Figure 4:
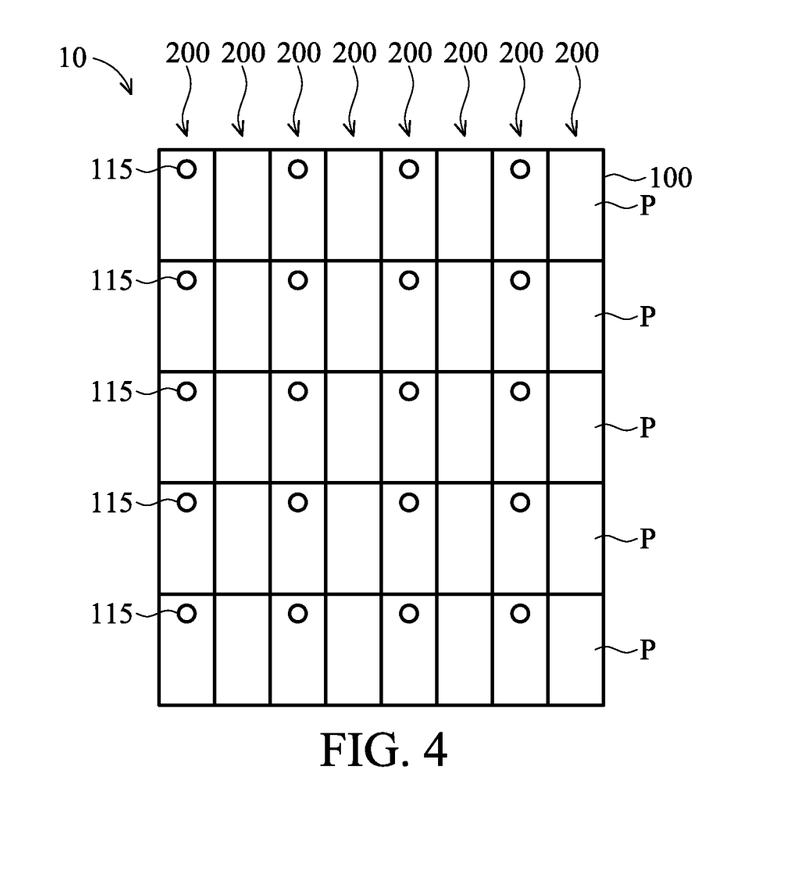
FIG. 4 is a plan view of another embodiment of an arrangement of electrode contact holes according to the invention.

Refer to FIG. 4, which is a plan view of another embodiment of the arrangement of electrode contact holes according to the invention. Elements in FIG. 4 that are the same as those in FIG. 3 are labeled with the same numbers as in FIG. 3 and are not described again for brevity. In the embodiment, in the pixel structure 10, the electrode contact holes 115 may be regularly arranged in each sub-pixel region P in at least two series of sub-pixel regions 200, and the at least two series of sub-pixel regions 200 are separated by at least a series of sub-pixel region 200 without an electrode contact hole 115.

Figure 5:
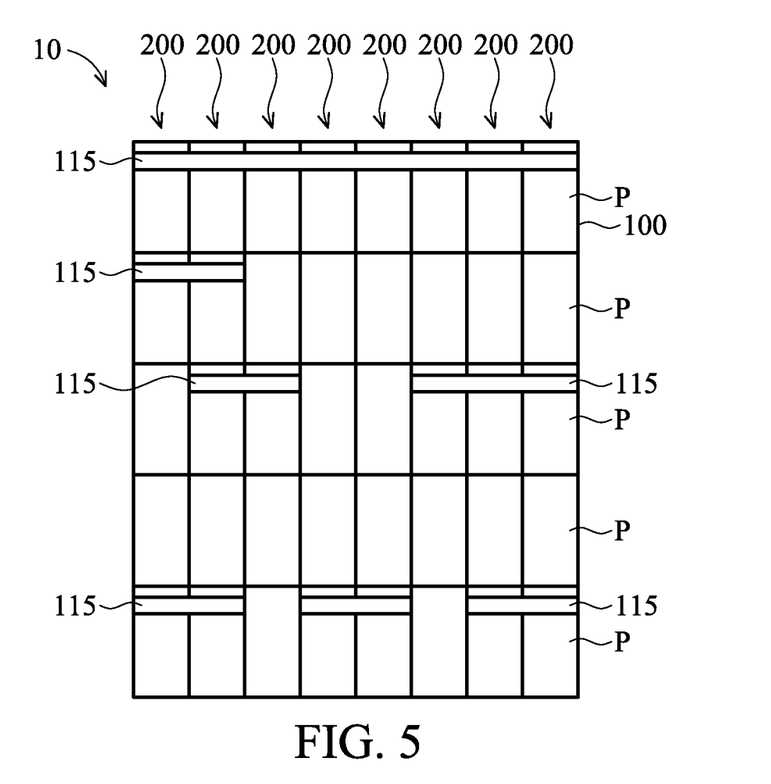
FIG. 5 is a plan view of yet another embodiment of an arrangement of electrode contact holes according to the invention.

Refer to FIG. 5, which is a plan view of yet another embodiment of the arrangement of electrode contact holes according to other embodiment of the present invention. Elements in FIG. 5 that are the same as those in FIG. 3 are labeled with the same numbers as in FIG. 3 and are not described again for brevity. In the embodiment, in the pixel structure 10, the electrode contact holes 115 may be irregularly arranged in each series of sub-pixel regions 200. Moreover, the electrode contact hole 115 may be a strip trench extended across the plurality of sub-pixel regions P.

It is understood that the arrangement of the electrode contact holes 115 in FIGS. 3-5 can be implemented in the pixel structures 10, 20, 10' and 20' shown in FIGS. 1D, 1E, 2C and 2D. Moreover, it is noted that the arrangements of the electrode contact holes 115 depends on design requirements and are not limited to the arrangement of the electrode contact holes 115 shown in FIGS. 3 to 5.

According to the above embodiments, in the display region of the organic light emitting display, the upper electrode of the organic light-emitting diode may be coupled to a power voltage through the electrode contact holes and the auxiliary electrode, and therefore the IR drop effect can be suppressed through the power voltage. In other words, the brightness difference between the central pixel region and the peripheral pixel region in the display region is reduced, thus, uniformity of brightness is improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a pixel structure for an organic light-emitting display, comprising:
    providing a substrate having a plurality of series of sub-pixel regions arranged in parallel;
    forming an auxiliary electrode layer on the substrate, wherein the auxiliary electrode layer corresponds to at least a sub-pixel region in the plurality of series of sub-pixel regions, wherein the auxiliary electrode layer is coupled to a first power voltage;
    forming a first insulating layer on the substrate and covering the auxiliary electrode layer, wherein the first insulating layer has at least a first opening to partially expose the auxiliary electrode layer;
    forming a lower electrode layer on the substrate in each sub-pixel region in the plurality of series of sub-pixel regions;
    forming an organic light-emitting layer on each lower electrode layer, filling the first opening;
    forming an upper electrode layer on the organic light-emitting layer; and
    performing a laser process to the upper electrode layer and the organic light-emitting layer directly on the first opening to form at least a third opening therein, wherein the third opening is in the upper electrode layer and penetrates through the organic light-emitting layer, such that the upper electrode layer and the auxiliary electrode layer are connected via welding through the third opening.

2. The method as claimed in claim 1, further comprising: forming a second insulating layer between each lower electrode layer and the organic light-emitting layer, wherein the second insulating layer has a second opening corresponding to each lower electrode layer, such that the organic light-emitting layer contacts with each lower electrode layer through the second opening.

3. The method as claimed in claim 1, wherein the first opening is a hole or a strip trench.

4. The method as claimed in claim 1, wherein the third opening is a strip trench extending across a plurality of sub-pixel regions.

5. The method as claimed in claim 1, wherein a plurality of third openings are formed in the organic light-emitting layer by performing the laser process, such that the plurality of third openings are arranged in at least one of the plurality of series of sub-pixel regions.

6. The method as claimed in claim 5, wherein the plurality of third openings are correspondingly arranged in each sub-pixel region of the at least one series of sub-pixel regions.

7. The method as claimed in claim 5, wherein the adjacent ones in the plurality of third openings are separated by at least a sub-pixel region without the third opening.

8. The method as claimed in claim 5, wherein the plurality of third openings are arranged in at least two of the plurality of series of sub-pixel regions, and the at least two of the plurality of series of sub-pixel regions are separated by at least one series of sub-pixel regions without the third opening.

9. The method as claimed in claim 5, wherein each sub-pixel region in the at least one series of sub-pixel regions is employed to display the same color.

10. The method as claimed in claim 5, wherein the at least one series of sub-pixel regions includes sub-pixel regions for displaying different colors.

11. The method as claimed in claim 1, wherein the auxiliary electrode layer and the lower electrode are formed by the same conductive layer.

* * * * *